(12) United States Patent
Wang et al.

(10) Patent No.: US 9,372,227 B2
(45) Date of Patent: Jun. 21, 2016

(54) INTEGRATED CIRCUIT TEST SYSTEM AND METHOD

(71) Applicant: Taiwan Semiconductor Manufacturing Co., Ltd., Hsin-Chu (TW)

(72) Inventors: Mill-Jer Wang, Hsinchu (TW); Ching-Nen Peng, Hsinchu (TW); Hung-Chih Lin, Hsinchu (TW); Wei-Hsun Lin, Zhubei (TW); Hao Chen, New Taipei (TW); Chung-Han Huang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 396 days.

(21) Appl. No.: 13/792,323

(22) Filed: Mar. 11, 2013

(65) Prior Publication Data

US 2014/0253162 A1 Sep. 11, 2014

(51) Int. Cl.
G01R 31/20 (2006.01)
G01R 31/28 (2006.01)

(52) U.S. Cl.
CPC ........ G01R 31/2889 (2013.01); *G01R 31/2884* (2013.01)

(58) Field of Classification Search
CPC . G01R 1/0483; G01R 1/0466; G01R 31/2886
See application file for complete search history.

(56) References Cited

U.S. PATENT DOCUMENTS

| 6,480,978 | B1 * | 11/2002 | Roy | G01R 31/31905 |
| | | | | 714/724 |
| 7,078,927 | B2 * | 7/2006 | Tanida | G01R 31/2844 |
| | | | | 324/762.01 |
| 7,372,287 | B2 * | 5/2008 | Ezoe | G01R 31/31924 |
| | | | | 324/754.07 |
| 7,750,651 | B2 | 7/2010 | Chao et al. | |
| 7,924,035 | B2 * | 4/2011 | Huebner | G01R 31/31926 |
| | | | | 324/754.01 |
| 8,125,235 | B2 * | 2/2012 | Hung | G01R 31/2884 |
| | | | | 324/754.07 |
| 2003/0010976 | A1 * | 1/2003 | Grube | G01R 1/07314 |
| | | | | 257/48 |
| 2006/0214679 | A1 * | 9/2006 | Henson | G01R 31/2831 |
| | | | | 324/754.03 |
| 2008/0164894 | A1 * | 7/2008 | Kim | G01R 31/2886 |
| | | | | 324/754.08 |
| 2008/0174331 | A1 * | 7/2008 | Yuan-Chi | G01R 31/2886 |
| | | | | 324/750.3 |
| 2008/0284454 | A1 * | 11/2008 | Chih | G01R 31/2886 |
| | | | | 324/754.07 |
| 2009/0002012 | A1 * | 1/2009 | Doong | G01R 31/2853 |
| | | | | 324/762.03 |
| 2009/0179657 | A1 * | 7/2009 | Williamson | G01R 31/2889 |
| | | | | 324/754.08 |
| 2010/0134134 | A1 * | 6/2010 | Grover | G01R 31/2601 |
| | | | | 324/750.3 |
| 2010/0213950 | A1 * | 8/2010 | Liu | G01R 31/31907 |
| | | | | 324/537 |

(Continued)

*Primary Examiner* — Tung X Nguyen
*Assistant Examiner* — Dominic Hawkins
(74) *Attorney, Agent, or Firm* — Duane Morris LLP (57) ABSTRACT

A system for testing a device under test (DUT) includes a probe card and a test module. The probe card includes probe beds electrically coupled to a circuit board and a first plurality of electrical contacts coupled to the circuit board, which are for engaging respective ones of a plurality of electrical contacts of a test equipment module. Probes are coupled to respective probe beds and are disposed to engage electrical contacts of the DUT. The probe card includes a second plurality of electrical contacts coupled to the circuit board. The first and second pluralities of contacts are mutually exclusive. The test module includes a memory, a processor, and a plurality of electrical contacts electrically coupled to respective ones of the second plurality of electrical contacts of the probe card. The circuit board includes a first electrical path for electrically coupling the test equipment module to the test module.

17 Claims, 7 Drawing Sheets

(56) References Cited

U.S. PATENT DOCUMENTS

| | | | | |
|---|---|---|---|---|
| 2010/0229383 A1* | 9/2010 | Chao | ............... | G01R 1/0735 29/840 |
| 2011/0128022 A1* | 6/2011 | Choi | ............... | G01R 31/318511 324/750.3 |
| 2011/0254579 A1* | 10/2011 | Takeda | ............... | G01R 31/2894 324/762.01 |
| 2012/0097944 A1 | 4/2012 | Lin et al. | | |
| 2012/0153982 A1* | 6/2012 | Lee | ............... | G01R 31/31908 324/756.03 |
| 2012/0286814 A1 | 11/2012 | Wang et al. | | |
| 2013/0063172 A1* | 3/2013 | Hsu | ............... | G01R 1/07314 324/754.09 |
| 2013/0073907 A1* | 3/2013 | Han | ............... | G01R 31/31858 714/32 |
| 2013/0179745 A1* | 7/2013 | Huang | ............... | G01R 31/31715 714/733 |
| 2014/0139251 A1* | 5/2014 | De La Puente | ............... | G01R 31/2834 324/756.03 |

\* cited by examiner

INTEGRATED CIRCUIT TEST SYSTEM AND METHOD

BACKGROUND

Advances in various industries have been largely made possible by the decreasing feature size and increasing density of various electronic components in integrated circuits. To efficiently utilize space, circuit designers have used technologies such as three-dimensional integrated circuits (3D ICs) and chip-on-wafer-on-substrate circuits (CoWoS, also called 2.5D ICs). With these technologies, dies are stacked, e.g., with one on top of another die, and/or connected to package substrates using through-silicon vias (TSVs), wire-bonding, and/or flip-chip bonding.

Dies are commonly tested in association with various aspects of die manufacturing. For example, dies may be tested to determine which dies are "bad" dies that should be excluded from subsequent processing. Dies may be tested by testing the electrical characteristics (e.g., resistance, capacitance, leakage, and/or frequency) of the integrated circuits on the dies. In some testing approaches, a test equipment module, which may be automated and referred to as an automated test equipment (ATE) module, is used to apply a voltage to a first pad of a device under test (DUT), which may be a semiconductor device. A probe card containing a circuit board may be used to connect the ATE and the DUT, e.g., using contacts that mate with corresponding contacts of the ATE and DUT, and metallic probes or needles that engage contacts of the DUT. Through the application of a voltage, a current is achieved between the first pad and a second pad of the DUT which is also connected to the ATE module through the probe card, and the current can be measured. Alternatively, a current can be applied, and a voltage drop can be measured. Regardless of the specific test approach, data that is thus collected by the ATE can be used to determine electrical characteristics of the DUT, e.g., resistance of TSVs can be determined. Because the electrical properties (e.g., resistance) of an individual TSV are often too weak (small in value) to be detectable by the ATE, multiple TSVs may be chained together (e.g., in a daisy-chain configuration) to provide signal enhancement that facilitates measurement of the relevant electrical property.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

The various 2.5D and 3D IC testing approaches that use one or more daisy chains of TSVs (or other daisy chained interconnect structures) benefit from the signal enhancement that results from the daisy chain configuration, but the serial nature of the daisy chain also introduces some problems. A chain may have hundreds or thousands of links (e.g., between TSVs), and a failed chain (i.e., chain that does not conduct current along the entirety of the chain) could result from a failure at any of those links, which may be due to a failed contact or broken wire in the device under test (DUT), for example. Another possibility is that failure might be due to incomplete contact between the probe card's needles (probes) and the contacts on the DUT. For example, if the ends of the needles are not coplanar, then an attempt to make between all the needles and the corresponding contacts on the DUT may not be successful. Defective needles on the probe card have traditionally been a difficult problem to diagnose.

Various embodiments of the present disclosure address these and other challenges that are encountered in IC testing. A test module (130 in FIG. 1) is provided in various embodiments to connect with the DUT (140 in FIG. 1) and with the test equipment module (110 in FIG. 1), to facilitate efficient identification of failures in a daisy chain of interconnects or failures at the probe card level.

Figure 1:
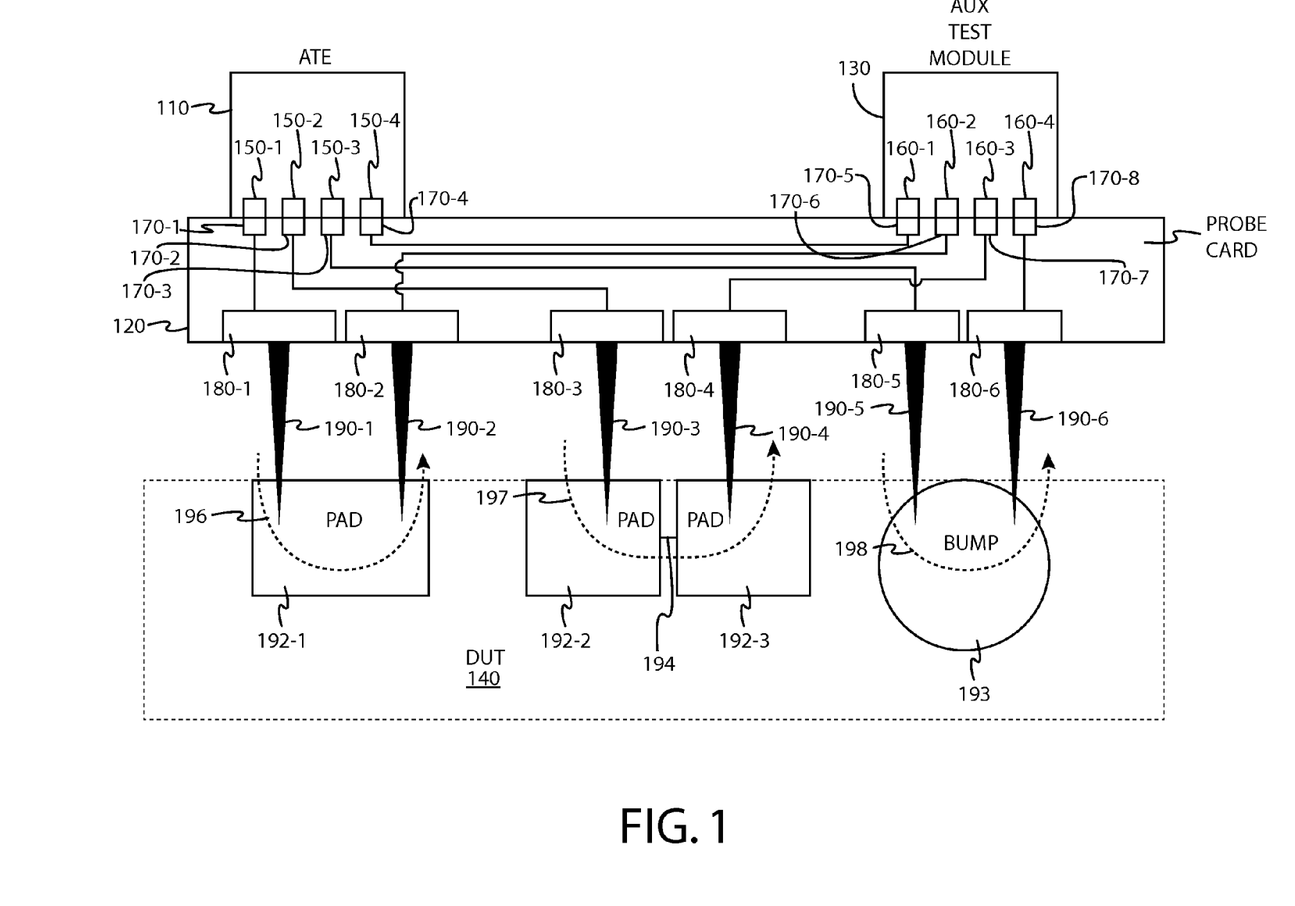
FIG. 1 is a diagram of a testing system in accordance with some embodiments of the present disclosure.

FIG. 1 is a diagram of a testing system in accordance with some embodiments of the present disclosure. Test module 130, which may be referred to as an auxiliary test module 130, is coupled to a probe card 120 by respective electrical contacts. Test signals are received by the probe card 120, e.g., from test equipment module 110. These signals may be conducted to the auxiliary test module 130 and routed back to form a loop that is beneficial for testing in several ways discussed further below. The test equipment module 110 may include a memory and a processor and is configured to generate and transmit test signals for testing (e.g., wafer-level testing) a device 140, which is referred to as the device under test (DUT) 140. Test equipment module 110 may be configured to generate and transmit the test signals automatically and may be referred to as automated test equipment (ATE) module 110 or ATE 110. The DUT 140 may be any device which has electrical characteristics (e.g., voltage or current characteristics) that are desired to be measured and/or tested. In some embodiments, the DUT 140 is a semiconductor device such as silicon-based device. In FIG. 1, the contacts of the ATE 110 are labeled 150-1, ..., 150-4 (generally contacts 150), the contacts of the auxiliary test module 130 are labeled 160-1, ..., 160-4 (generally contacts 160), and the contacts of the probe card 120 are labeled 170-1, ..., 170-8 (generally contacts 170). It is understood that any number of contacts may be present at the ATE 110, the auxiliary test module 130, and the probe card 120, and the couplings between respective pairs of contacts may be with a direct physical mating as shown in FIG. 1 (using any suitable contact interface) or with an indirect coupling, e.g., using intermediate wires or cables.

Probe card 120 includes multiple probe beds 180-1, ..., 180-6 (generally probe beds 180) that are coupled to a circuit board. The probe beds 180 are also known as needle beds or needle substrates. The circuit board includes circuitry for electrically coupling various contacts 170 of the probe card 120 to various probe beds 180, e.g., as shown in FIG. 1 and other figures discussed below. Multiple test probes 190-1, ..., 190-6 (generally probes 190), which may be in the form of metallic needle-like structures (sometimes referred to as needles) are coupled to respective probe beds and are configured to engage respective electrical contacts of the DUT 140. The probes 190 may be disposed in a substrate as described in U.S. Pat. No. 7,750,651 to Chao, which is hereby incorporated by reference herein in its entirety. Various types of electrical contacts of the DUT, such as pads 192-1, 192-2, 192-3 (generally pads 192) or metal bump structure 193 found in 2.5D and 3D ICs, may be engaged by the probes 190 to achieve electrical coupling. Bumps may be provided for connecting TSVs to other TSVs or to a substrate, and may be made of various types of metal such as solder, gold, copper, etc., as described in U.S. patent application Ser. No. 13/006,639 to Lin, which is hereby incorporated by reference herein in its entirety.

Some of the pads 192 may be chained together, e.g., using one or more interconnect structures 194, to form a daisy chain which provides signal enhancement to facilitate testing.

Figure 2A:
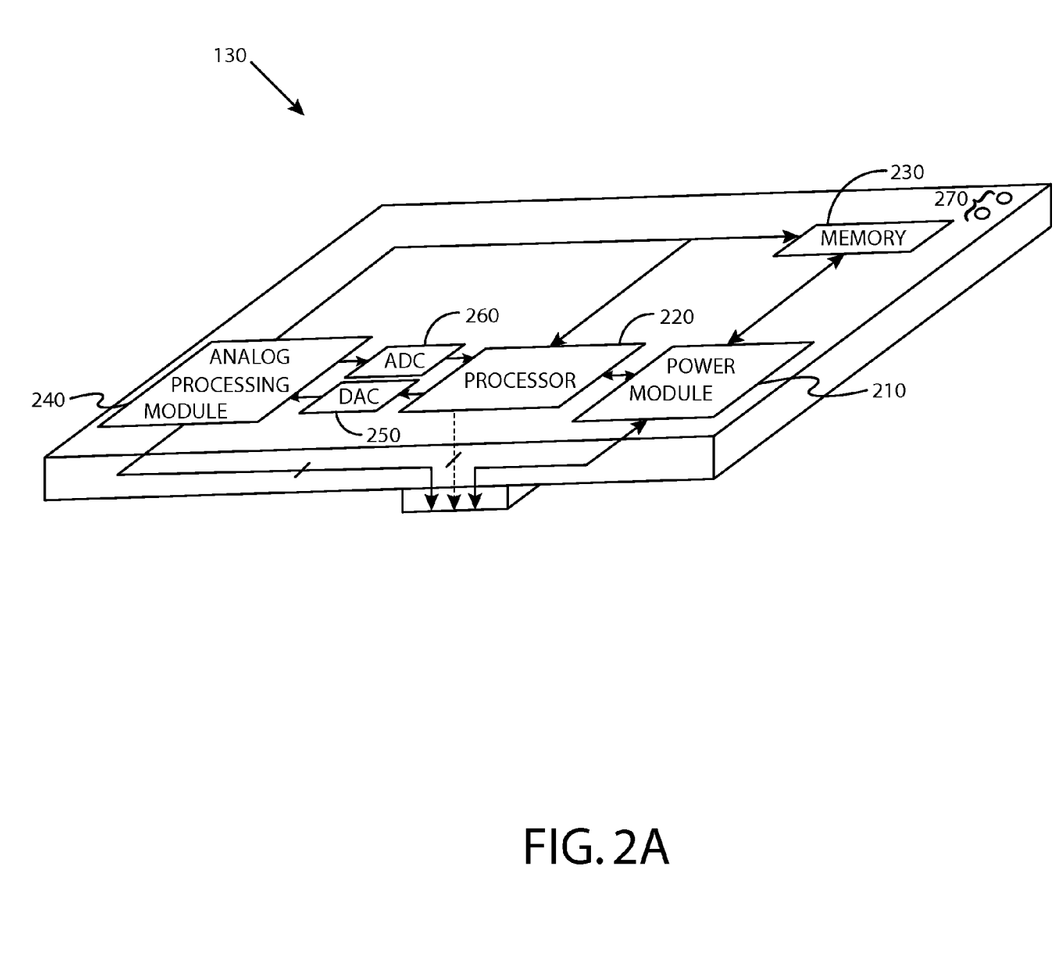
FIG. 2A is a block diagram of an auxiliary test module in accordance with some embodiments.

The general configuration shown in FIG. 1 provides various advantages for testing, which are discussed further below. Many of these advantages are due to functionality made possible by auxiliary test module 130, which is shown in greater detail in FIG. 2A. As shown in FIG. 2A, auxiliary test module 130 includes a processor 220 and a memory 230. The processor 220 may be a field programmable gate array (FPGA), built-in self-test (BIST) module, or any other computer processor capable of logically switching testing channels and generating and transmitting signals for testing. The memory 230 may be a non-volatile memory for storing test settings or test results. A power module 210 includes a voltage regulator to supply the appropriate voltage and/or power to the processor 220 and memory 230. An analog processing module 240 may also be provided for various types of analog signal processing, e.g., DC analog parameter measurement. If the analog processing module 240 is used, a digital-to-analog converter 250 and analog-to-digital converter 260 may be provided as shown in FIG. 2A, and the analog processing module 240 outputs a signal, which may be a multi-bit signal referred to as a loopback or feedback signal because it can provide feedback information regarding testing to the ATE 110. If the analog processing module 240 is not used or not available, processor 220 may itself provide the loopback signal, as shown with broken lines in FIG. 2A at the output of processor 220. The analog processing module 240 may be a field programmable analog array (FPAA) or a digital multimeter (DMM).

The loopback signal may be transmitted from the auxiliary test module 130 to the ATE 110 along circuitry of the probe card that couples contacts 170-5 and 170-4 (see FIG. 1), for example. Thus, in some embodiments a test signal (which may be a current signal, a voltage signal, or any other test signal used for measuring electrical characteristics of the DUT 140) is propagated from the ATE 110 to the auxiliary test module 130 (specifically, by way of the probe card 120 and DUT 140), and a loopback (feedback) signal is returned to the ATE 110, by way of the probe card 120 and DUT 140. For example, a test signal may be sent from ATE 110 to the auxiliary test module 130 by way of contact 170-1, probe bed 180-1, probe 190-1, pad 192-1, probe 190-2, and contact 170-6. Then, a loopback signal may be sent from the auxiliary test module to the ATE 110 by way of contact 170-5 and contact 170-4. If probe 190-2 is not making sufficient contact with pad 192-1 to provide electrical coupling, then the test signal attempting to traverse the above-described path would not be able to reach the auxiliary test module 130 due to the failed link in the path. If, on the other hand, the test signal does reach the auxiliary test module, then it may be concluded that probe 190-2 (along with all the other parts of the path) is working properly, and the loopback signal indicates that status.

As shown in FIG. 1, two probes 190 may be coupled to a single electrical contact of the DUT 140 (e.g., to pad 192-1 or bump 193), or different probes (e.g., probes 190-3 and 190-4) may be coupled to respective contacts (such as pads 192-2 and 192-3, which are themselves chained to each other by an interconnect structure 194). With any of these configurations, the auxiliary test module 130 receives a test signal from one or more pads or bumps and sends a loopback signal to the ATE 110 to inform the ATE 110 about the status of a desired contact between a probe 190 and a pad/bump of the DUT 140. The "dual tip" configuration where two test probes are coupled to a single pad (or bump) of the DUT 140 enables finer control for isolating problems than has been possible with other testing approaches. In some embodiments, the size of an electrical contact of DUT 140, e.g., pad 192, is large enough (e.g., pad width of 150 μm) to enable at least two probe tips (e.g., spaced 100 μm apart) to make electrical contact with the pad.

Figure 2B:
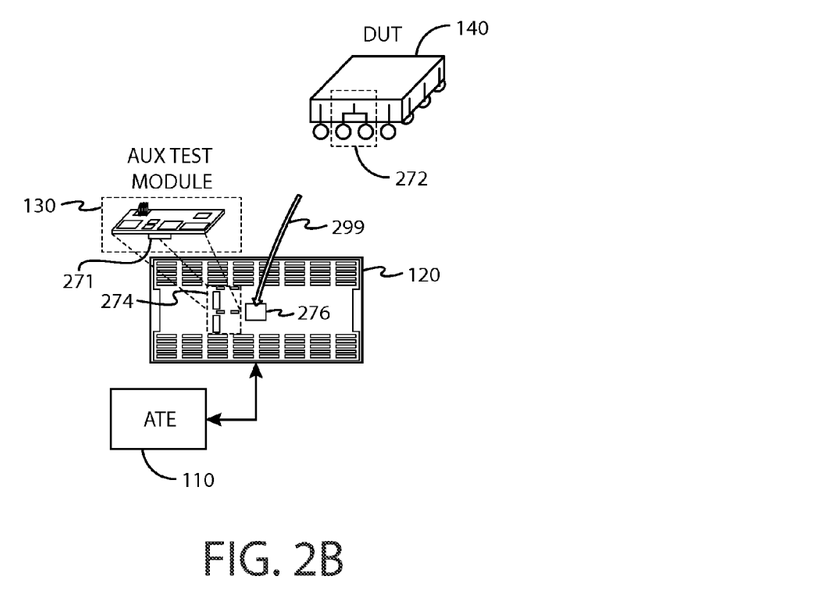
FIG. 2B is a diagram illustrating how the auxiliary test module of FIG. 2A relates to other components of a testing system in accordance with some embodiments.

In some embodiments, a "dual bump" configuration is provided, wherein a single probe 190 is coupled to two bumps. The dual bump and dual tip configurations are implemented at a final test (FT) stage of processing (i.e., final packaging of the IC) in some embodiments, and these configurations may be understood with reference to FIGS. 2B-2D. FIG. 2B is a diagram showing how the auxiliary test module 130 and other components connect to the probe card 120. Probe card 120 has one or more connectors 274 configured to mate with a corresponding connector 271 of the auxiliary test module 130 to provide electrical coupling between the probe card 120 and the auxiliary test module 130. Probe card 120 has a socket 276 into which the DUT 140 may be inserted as shown by arrow 299. In some embodiments, the DUT 140 includes a dual bump structure 272 that has two bumps that are electrically coupled to one another at the DUT.

Figure 2C:
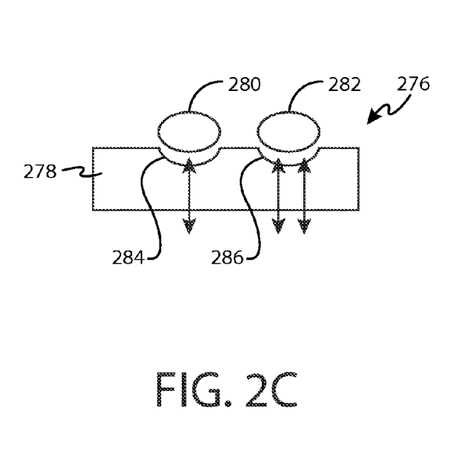
FIG. 2C is a side view of a socket interface in accordance with some embodiments.

FIG. 2C is a side view of socket 276 in some embodiments. A socket substrate 278 (also referred to as a needle bed) includes receptor areas 284, 286 configured to receive respective bumps 280, 282 of the DUT 140 for electrical coupling. One electrical path is provided in the socket substrate 278 for coupling bump 280 of the DUT 140 to the PCB of probe card 120 (not shown in FIG. 2C), and two electrical paths are provided for coupling bump 282 to the PCB. Thus, the socket substrate 278 is an interface between the DUT 140 and the PCB of the probe card 120.

Figure 2D:
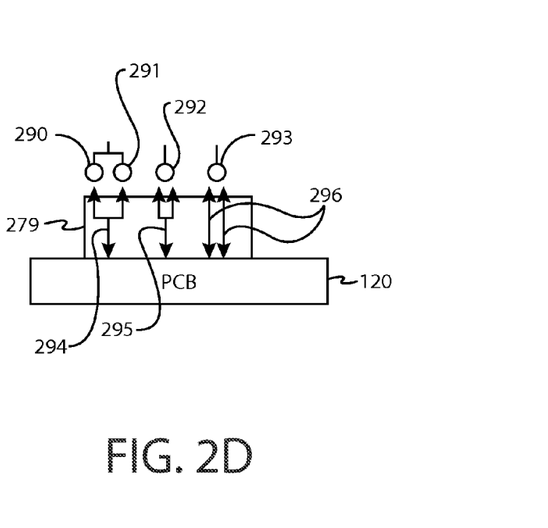
FIG. 2D is another side view of a socket interface in accordance with some embodiments.

In another example of a side view of a socket substrate, various types of electrical paths may be provided in socket substrate 279, as shown in FIG. 2D. Bumps 290 and 291 of the DUT 140 (which may be the same as the bumps in dual bump structure 272 of FIG. 2B) are coupled to respective receptor areas of substrate 278 which are electrically coupled together by electrical path 294 for provision to the PCB of probe card 120. Two contacts are provided for bump 292, and these contacts are coupled together by electrical path 295. Electrical paths 296 and bump 293 are in a configuration similar to the right side of FIG. 2C. Thus, not only can a dual bump or dual pad configuration be implemented as shown in FIG. 1 on the DUT 140, but the socket substrate (278 or 279) can be used to provide dual bump functionality.

Figure 3:
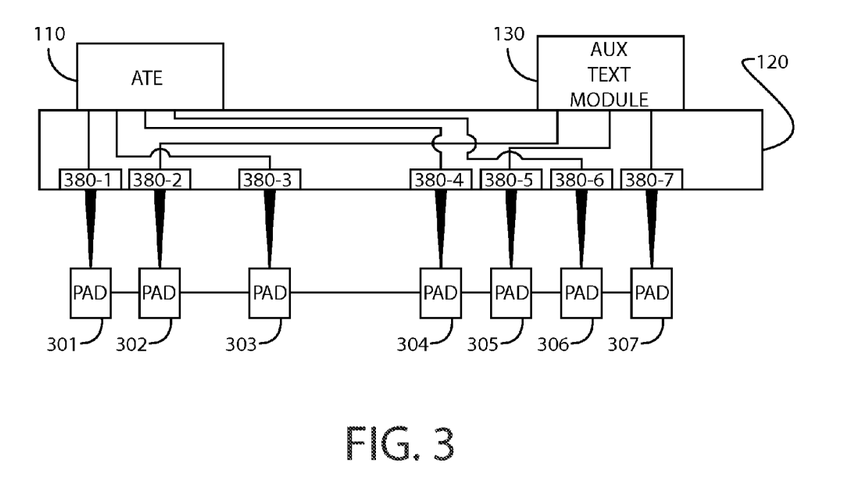
FIG. 3 is an illustration of a testing configuration in accordance with some embodiments.

FIG. 3 shows another configuration for which various embodiments assist with testing. In this example, pads 301, 302, . . . , 307 of a DUT (e.g., DUT 140) are chained together to form a single daisy chain. For simplicity, contacts of the ATE 110, probe card 120, and auxiliary test module 130 are not shown in FIGS. 3 and 4. As shown, the ATE 110 may contribute some of the tester channels that couple to some of the probe beds (in this case, probe beds 380-1, 380-3, 380-4, and 380-6), and the auxiliary test module 130 may also contribute some tester channels that couple to other probe beds (in this case, probe beds 380-2, 380-5, and 380-7). The tester channels contributed by the auxiliary test module 130 may be helpful, for example, when the tester channels available from the ATE 110 are limited in number. If all the pads of the DUT are chained together properly, then a test signal will be conducted correctly from pad 301 to pad 307. If, on the other hand, one of the links in the daisy chain is "broken," then the faulty link can be quickly detected using the configuration shown in FIG. 3.

Figure 4:
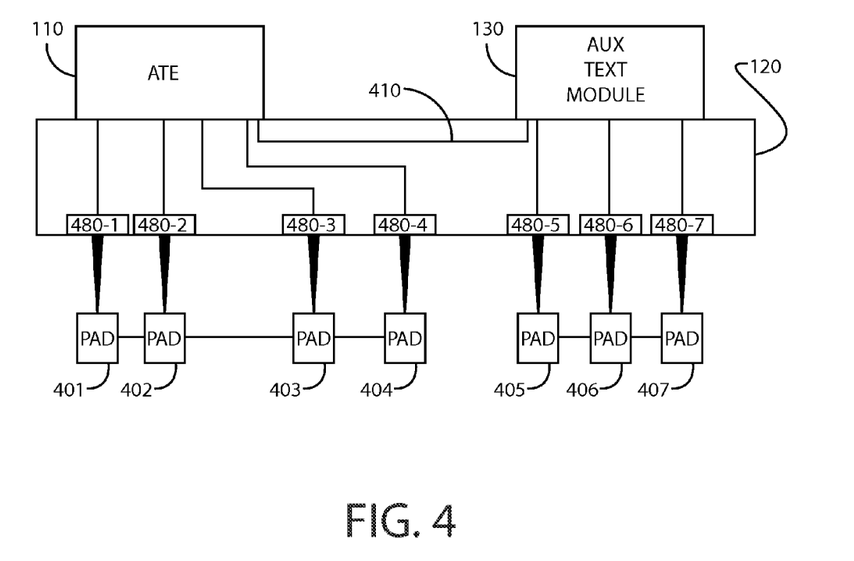
FIG. 4 is an illustration of a testing configuration in accordance with some embodiments.

Another example configuration is shown in FIG. 4. In this example, pads 401, 402, 403, and 404 of a DUT (e.g., DUT 140) are chained together, pads 405, 406 and 407 are chained together, and pads 401-407 are electrically coupled to respective test probes that are in turn coupled to respective probe beds 480-1, . . . , 408-7 (generally probe beds 480). If the number of test channels provided by the ATE 110 is insufficient for testing all the pads in both of these chains, the auxiliary test module 130 may handle some of the testing independently, e.g., by entirely handling the chain formed by pads 405, 406, and 407. An electrical path 410 (e.g., the path between contact 170-4 and 170-5 in FIG. 1) is used to send control information from the ATE 110 to the auxiliary test module 130 and to configure the auxiliary test module 130 for transmission, sampling, and/or comparison of signals. Multiple electrical lines may be used for path 410.

Figure 5:
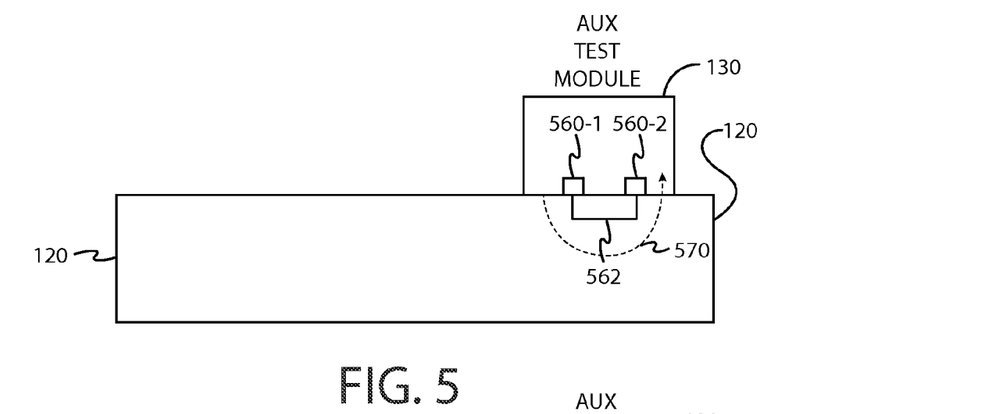
FIG. 5 illustrates a configuration for a connector check that may be performed in accordance with some embodiments.

FIG. 5 illustrates a configuration for a connector check that may be performed in accordance with some embodiments. This connector check is also shown as block 910 of FIG. 9. As shown in FIG. 5, circuitry 562 couples contact 560-1 to contact 560-2. When the auxiliary test module 130 is properly connected (coupled) to the probe card, a signal sent by the auxiliary test module 130 along path 570 is received by the auxiliary test module 130. Upon receipt of this signal, the connection status of "properly connected" is confirmed.

Figure 6:
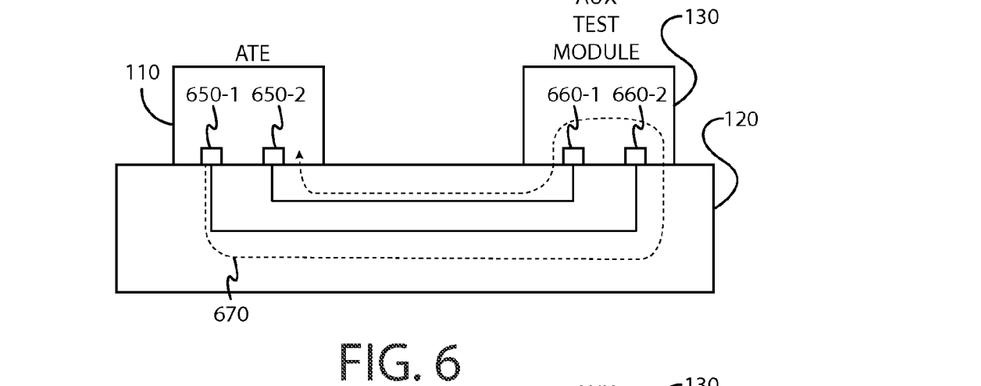
FIG. 6 illustrates a configuration for performing a self-check using the auxiliary test module 130.

FIG. 6 illustrates a configuration for performing a self-check using the auxiliary test module 130 in accordance with some embodiments. This self-check is also shown as block 920 of FIG. 9. Referring to FIG. 6, a signal is sent through probe card 120, from contact 650-1 to contact 660-2. A signal (which can be the same or different from the signal sent from contact 650-1) is then sent from contact 660-1 to contact 650-2. In some embodiments, contact 650-2 is the same as contact 150-4 (FIG. 1), and contact 660-1 is the same as contact 160-1, to use the same loopback path for the self-check as for the check of contacts of the DUT 140. Thus, upon completion of path 670, it is confirmed that the auxiliary test module 130 is working properly and that the loop functionality is operational.

Figure 7:
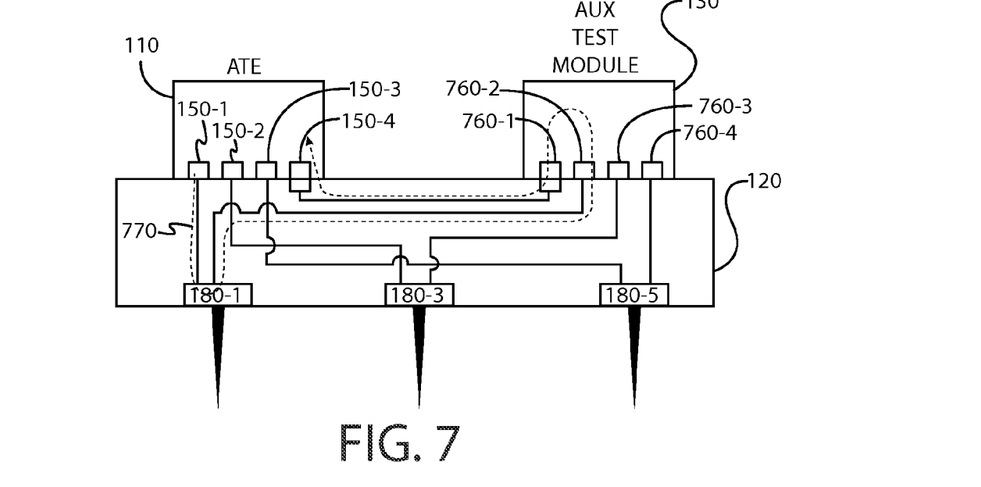
FIG. 7 illustrates a configuration for performing a probe card check in accordance with some embodiments

FIG. 7 illustrates a configuration for performing a probe card check (i.e., for verifying that the probe card itself is working correctly, without regard to an external DUT) in accordance with some embodiments. This probe card check is also shown as block 930 of FIG. 9. Referring to FIG. 7, probe beds 180-1, 180-3, and 180-5 are each coupled to one of the contacts of the ATE 110 and also to one of the contacts of the auxiliary test module 130. Thus, there are three different paths that have one endpoint at the ATE 110 and another endpoint at the auxiliary test module 130 and that also contact respective ones of the probe beds 180. Probe bed 180-1 is coupled to contact 150-1 of the ATE 110 and also to contact 760-2 of the auxiliary test module 130. A signal sent by the ATE 110 from contact 150-1 will reach probe bed 180-1 and then will reach contact 760-2, assuming the relevant part of the circuit board (e.g., the relevant wires) are working properly. Then, a loopback signal is sent from contact 760-1 to contact 150-4. In some embodiments, contact 760-1 is the same as contact 160-1 (FIG. 1), to use the same loopback path for the probe card check as for the check of contacts of the DUT 140. Thus, upon completion of path 770, it is confirmed that the portion of the probe card 120 involving path 770 is working properly. This kind of test helps to diagnose whether a problem is due to a faulty test probe 190 or instead due to faulty internal circuitry of the probe card 120. The three paths (loops) in FIG. 7 (i.e., path 770 which is coupled to probe bed 180-1, and the similar paths coupled to probe beds 180-3 and 180-5, respectively) may be attempted serially (i.e., one after the other), and a loopback signal may be sent from the auxiliary test module 130 to the ATE 110 after each individual path is attempted or after all of the paths have been attempted. Alternatively, in some embodiments all of the paths may be attempted concurrently (in parallel). The probe card check in accordance with some embodiments provides a fast alternative to other probe card inspection techniques that are relatively slow.

To perform a contact check, the couplings between the test probes 190 and the electrical contacts (e.g., pads or bumps) of the DUT 140 can also be tested using the principle of looping. This contact check is shown as block 940 of FIG. 9. Referring back to FIG. 1, portions of three paths from the ATE 110 to the auxiliary test module 130 are labeled as 196, 197, and 198, respectively. Each of these paths can be attempted, e.g., serially (one after the other) or in parallel (concurrently). If a signal along one of these paths is received successfully at the ATE 110, then it is confirmed that all the components along the path are working properly and that the proper couplings are achieved at each location. A loopback signal can be sent from the auxiliary test module 130 to the ATE 110 by way of contacts 170-5 and 170-4 to indicate that the relevant components and/or paths are working correctly (or not working correctly, as the case may be).

If any of the four checks listed above (connector check as in FIG. 5; auxiliary test module self-check as in FIG. 6; probe card check as in FIG. 7; contact check as in FIG. 1) fail (indicate unsuccessful results), subsequent processing may be paused or stopped, and the problem may be diagnosed and isolated. For example, if the probe card check reveals faulty wiring within the probe card for a particular path from the ATE 110 to the auxiliary test module 140, then appropriate steps can be taken (such as flagging that path for future exclusion, excluding the entire probe card, etc.). Similarly, various embodiments of the present disclosure may reveal a defect in a test probe 190. For example, referring to the configuration of FIG. 3, if a test signal is conducted from the ATE 110 to the auxiliary test module 130 by way of probe bed 380-1, pad 301, pad 305, and probe bed 380-5 but is not conducted to the auxiliary test module by way of probe bed 380-2, then it is confirmed that the problem lies not with the links in the chain between pad 301 and chain 305, but rather either with the probe corresponding to pad 302 or with the electrical coupling between that probe and pad 302. When one probe coupled to a chain of pads is being used to transmit a test signal, the other probes coupled to that chain are expected to receive the test signal. To diagnose various errors, each probe in sequence can be designated as the transmitting probe.

If the four checks listed above pass (connector check as in FIG. 5; auxiliary test module self-check as in FIG. 6; probe card check as in FIG. 7; contact check as in FIG. 1) pass (indicate successful results), testing may proceed to make electrical measurements (block 950 of FIG. 9).of the DUT 140 Each successive check out of the four checks listed above rules out some of the possible possibilities for error, thus allowing any problems to be efficiently diagnosed. Various testing techniques may be used to carry out the electrical measurements (block 950), e.g., using the ATE 110, the probe card 120, the auxiliary test module 130, and the DUT 140. For example, resistance may be measured with a four-point Kelvin measurement that uses analog processing.

Referring to FIG. 2A, in some embodiments, one or more displays (e.g., implemented with LEDs or other illumination techniques) 270 are provided on the auxiliary test module 130 to provide real-time visual feedback regarding testing status. For example, during a probe card check (FIG. 7), various paths may be attempted serially (one after the other), and after each path attempt either a green light (success) or a red light (fail) may be displayed at display 270. Thus, status (e.g., of the probe card 120) is monitored in real-time.

Figure 8:
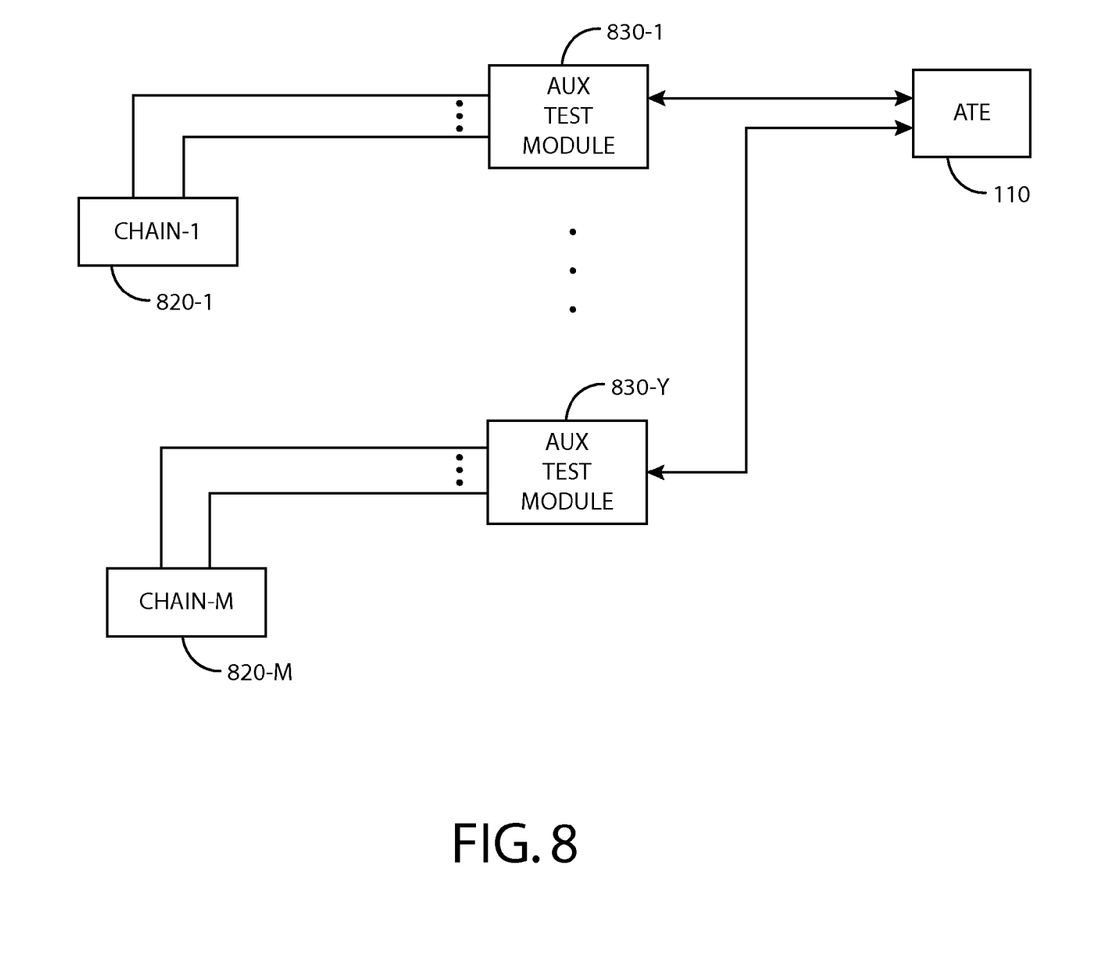
FIG. 8 is a block diagram of a multiple auxiliary test module configuration in accordance with some embodiments.

In some embodiments, multiple auxiliary test modules are coupled to a single ATE (or to a single processor generally), as shown in FIG. 8. In FIG. 8, ATE 110 is coupled to auxiliary test modules 830-1, . . . , 830-Y (Y is an integer). In some embodiments, ATE 110 communicates with all of the auxiliary test modules simultaneously, e.g., if a multi-core processor is used at the ATE 110. Each auxiliary test module 830-$i$ provides channels for coupling to one or more daisy chains of DUT contacts, and effectively functions as a switch box or converter for converting between a parallel data interface (channels from the DUT daisy chains) and a serial data interface (loopback signal to the ATE 110). With a single auxiliary test module (as in FIG. 1, for example) the total number of tester channels is N+1, where N is the number of channels for coupling to probe beds 180, and "+1" corresponds to the loopback signal providing feedback to the ATE 110. With the approach of FIG. 8, the total number of I/O channels for all of the switch boxes (auxiliary test modules) is equal to the number of tested tips (number of parallel channels from DUT daisy chains) plus the number of loopback signals (number of serial channels to the ATE 110). Each DUT daisy chain can have a different number of channels, and the respective auxiliary test module can also provide different numbers of channels. In this example, a total of M chains (chain 820-1, . . . , chain 820-M) are thus accommodated. Thus, large numbers of chains or long individual chains which would otherwise strain resources of other test approaches (e.g., due to a limited number of test channels) may be handled efficiently.

As discussed above, FIG. 9 shows various checks and processing in accordance with some embodiments. At block 910, a connector check is performed with auxiliary test module 130 and probe card 120, to ensure that the auxiliary test module 130 is connected to the probe card 120 correctly (see discussion above regarding FIG. 5). At block 920, a loop self-check is performed with ATE 110, probe card 120, and auxiliary test module 130, to ensure that a signal is capable of being sent around a loop (see discussion above regarding FIG. 6). At block 930, a probe card check is performed with ATE 110, probe card 120, and auxiliary test module 130, to verify that the probe card 120 is operating correctly (see discussion above regarding FIG. 7). At block 940, a contact check is performed with ATE 110, probe card 120, auxiliary test module 130, and DUT 140, to test contacts of DUT 140, e.g., using the principle of looping in accordance with some embodiments. At block 950, testing is performed to measure electrical characteristics of DUT 140. For example, by sending appropriate current or voltage test signals, properties such as resistance of various components of the DUT 140 can be measured.

In some embodiments, a system for testing a device under test (e.g., DUT 140) includes a probe card (e.g., probe card 120) and at least one test module (e.g., test module 130). The probe card includes multiple probe beds (e.g., probe beds 180) electrically coupled to a circuit board. The probe card also includes a first plurality of electrical contacts (e.g., contacts 170-1, . . . , 170-4) coupled to the circuit board, wherein the first plurality of contacts are for engaging respective ones of a plurality of electrical contacts (e.g., contacts 150-1, . . . , 150-4) of a test equipment module (e.g., ATE module 110) configured to provide test signals for testing the device under test. The probe card further includes probes (e.g., probes 190) coupled to respective probe beds, wherein the probes are disposed to engage electrical contacts (e.g., pads and/or bumps) of the device under test. The probe card also includes a second plurality of electrical contacts (e.g., contacts 170-5, . . . , 170-8) coupled to the circuit board. The first and second pluralities of contacts are mutually exclusive (i.e., none of the contacts of the first plurality of contacts are among the second plurality of contacts, and vice-versa). The test module(s) includes a plurality of electrical contacts (e.g., contacts 160-1, . . . , 160-4) electrically coupled to respective ones of the second plurality of electrical contacts of the probe card. The circuit board includes a first electrical path (e.g., path between contact 170-5 and contact 170-4) for electrically coupling the test equipment module to the test module. The first electrical path may be used to conduct a loopback signal that closes a loop (provides feedback from the test module to the test equipment module) and promotes efficient testing of the device under test.

Figure 9:
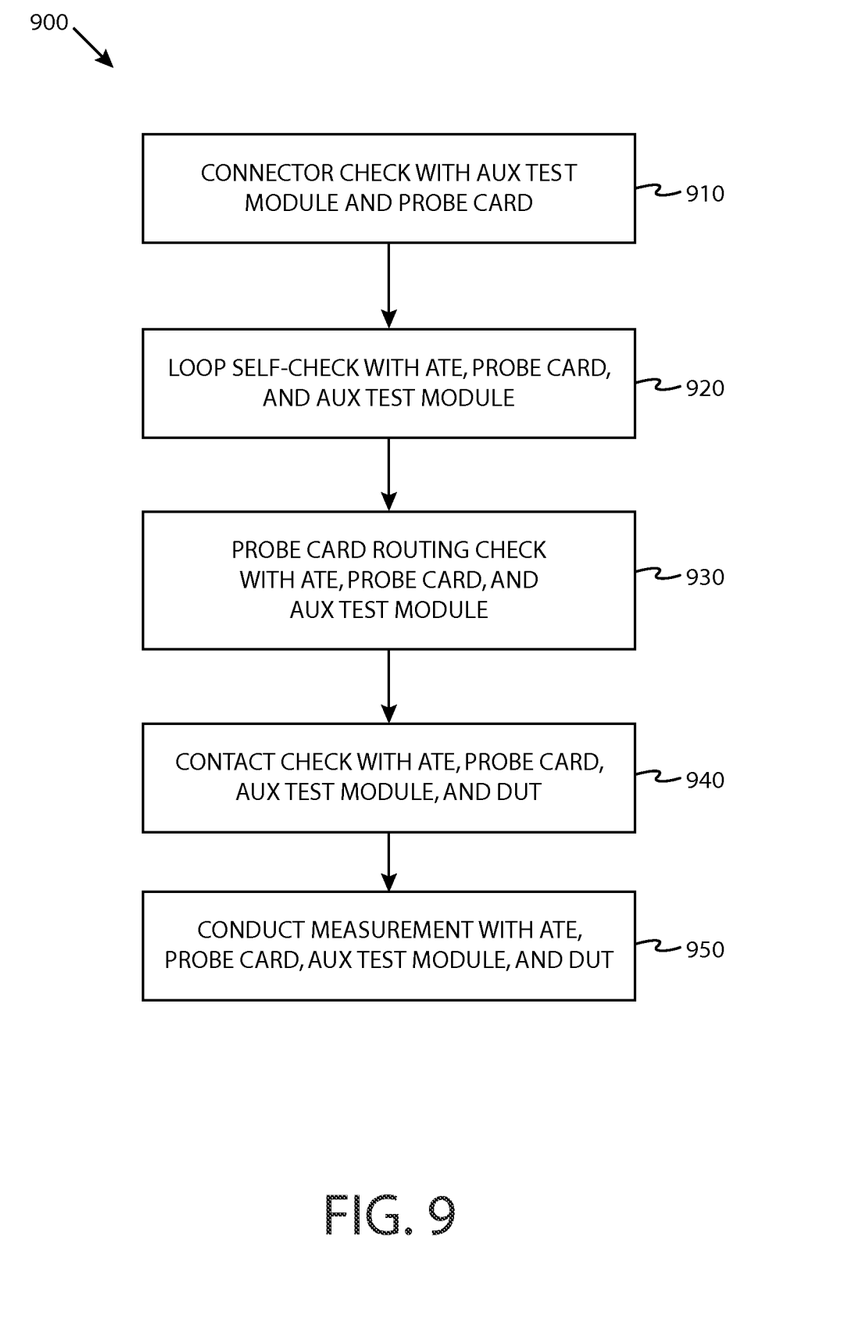
FIG. 9 is a flow diagram of a process in accordance with some embodiments.

In some embodiments, a method includes providing a first signal at a test module (e.g., test module 130). The first signal may be a test signal such as a current signal or a voltage signal, or any other kind of test signal that is used for testing an IC. The first signal is sent to a probe card (e.g., probe card 120) electrically coupled to the test module. The probe card includes multiple probe beds (e.g., probe beds 180) coupled to respective probes among a plurality of probes (e.g., probes 190). A return of the first signal from the probe card is detected. Thus, a connector check as in block 910 of FIG. 9 is performed. At a test equipment module (e.g., ATE module 110) electrically coupled to the probe card, a second signal is provided. A round-trip propagation of the second signal from the test equipment module to the probe card and back to the test equipment module is detected. Thus, a loop check as in block 920 of FIG. 9 is performed. For each path among a plurality of electrical paths through a circuit board of the probe card, a third signal is sent along the path to the test module, wherein the path is coupled to a respective probe bed of the probe card. A fourth signal (e.g., loopback signal) is sent from the test module to the test equipment module, wherein the fourth signal indicates a status of each path in the first plurality of electrical paths. Thus, a probe card check as in block 930 of FIG. 9 is performed.

In some embodiments, a first signal is sent from a test equipment module (e.g., ATE module 110) to a test module (e.g., auxiliary test module 130) by way of first and second probes (e.g., probes 190-3 and 190-4, respectively) among a plurality of probes of a probe card (e.g., probe card 120). The first probe is coupled to a first electrical contact (e.g., pad 192-2) of a device under test (e.g., DUT 140), the first electrical contact is coupled to a second electrical contact (e.g., pad 192-3) of the device under test, and the second probe is coupled to the second electrical contact. A second signal (e.g., loopback signal), indicating a connectivity status of the first and second probes, is sent from the test module to the test equipment module.

Although examples are illustrated and described herein, embodiments are nevertheless not limited to the details shown, since various modifications and structural changes may be made therein by those of ordinary skill within the scope and range of equivalents of the claims.

What is claimed is:

1. A system for testing a device under test (DUT), the system comprising:
    a probe card including:
        a plurality of probe beds electrically coupled to a circuit board;
        a first plurality of electrical contacts coupled to the circuit board, the first plurality of contacts for engaging respective ones of a plurality of electrical contacts of a test equipment module configured to provide test signals for testing the DUT;
        a plurality of probes coupled to respective probe beds, the plurality of probes disposed to engage a plurality of electrical contacts of the DUT; and
        a second plurality of electrical contacts coupled to the circuit board, wherein the first and second pluralities of contacts are mutually exclusive;
    at least one test module including a plurality of electrical contacts electrically coupled to respective ones of the second plurality of electrical contacts of the probe card;
    wherein the circuit board includes a first electrical path for electrically coupling the test equipment module to the test module,
    wherein each probe bed is coupled to one of the contacts in the first plurality of contacts through one of the paths in the first plurality of electrical paths, each probe bed is coupled to one of the contacts in the second plurality of contacts through one of the paths in the second plurality of electrical paths, and the first electrical path is not in the first or second pluralities of electrical paths.

2. The system of claim 1, wherein the circuit board further includes a second electrical path electrically coupling a pair of contacts among the second plurality of electrical contacts.

3. The system of claim 1, wherein the circuit board further includes a second electrical path for electrically coupling the test equipment module to the test module.

4. The system of claim 3, wherein the test module is configured to:
    detect a first signal received from the test equipment module via the second electrical path; and
    responsive to the detected first signal, send a second signal along the first electrical path.

5. The system of claim 1, wherein the test module is configured to:
    detect a first signal received from the test equipment module via one of the paths in the first plurality of electrical paths and one of the paths in the second plurality of electrical paths; and
    responsive to the detected first signal, send a second signal along the first electrical path.

6. The system of claim 1, wherein the test module is configured to:
    for each probe bed of the probe card, receive a first signal from the test equipment module via one of the paths in the first plurality of electrical paths and one of the paths in the second plurality of electrical paths, wherein the one path in the first plurality of electrical paths and the one path in the second plurality of electrical paths each have an endpoint at the probe bed; and
    send a second signal, indicating the status of each path in the first and second pluralities of electrical paths, along the first electrical path.

7. The system of claim 1, including a plurality of the test modules, wherein the circuit board includes respective electrical paths for coupling each test module to the test equipment module.

8. The system of claim 1, wherein the system further comprises the DUT, and a pair of the probes are coupled to a single electrical contact in the DUT.

9. The system of claim 8, wherein the pair includes first and second probes associated with first and second probe beds, respectively, and the circuit board further includes:
    a second electrical path coupling the first probe bed and one of the first plurality of electrical contacts; and
    a third electrical path coupling the second probe bed and one of the second plurality of electrical contacts.

10. The system of claim 1, wherein the system further comprises the DUT, the plurality of probes includes first and second probes electrically coupled to first and second electrical contacts, respectively, in the DUT, the first and second electrical contacts of the DUT are coupled together, and the circuit board further includes:
    a second electrical path coupling a first probe bed, associated with the first probe, to one of the first plurality of electrical contacts; and
    a third electrical path coupling a second probe bed, associated with the second probe, to one of the second plurality of electrical contacts.

11. The system of claim 1, wherein the test module further includes:
    a processor;
    an analog processing module configured to output a feedback signal along the first electrical path;
    a digital-to-analog converter configured to convert a digital output of the processor to an analog input of the analog processing module; and
    an analog-to-digital converter configured to convert an analog output of the analog processing module to a digital input of the processor.

12. The system of claim 11, wherein the analog processing module is a field programmable analog array.

13. The system of claim 11, wherein the analog processing module is a digital multimeter.

14. A method comprising:

at a test module, providing a first signal;

sending the first signal to a probe card electrically coupled to the test module, wherein the probe card includes a plurality of probe beds coupled to respective probes among a plurality of probes;

detecting a return of the first signal from the probe card;

providing a second signal by a test equipment module electrically coupled to the probe card;

detecting a round-trip propagation of the second signal from the test equipment module to the probe card and back to the test equipment module;

for each path among a plurality of electrical paths through a circuit board of the probe card, sending a third signal along the path to the test module, wherein the path is coupled to a respective probe bed of the probe card; and sending a fourth signal from the test module to the test equipment module, wherein the fourth signal indicates a status of each path in the first plurality of electrical paths, wherein first and second probes in the plurality of probes are electrically coupled to first and second electrical contacts, respectively, of a device under test (DUT), and the first and second electrical contacts are coupled together, the method further comprising:

sending a fifth signal from the test equipment module to the test module by way of the first probe, the DUT, and the second probe;

sending a sixth signal from the test module to the test equipment module, wherein the sixth signal indicates a connectivity status of the first and second probes.

15. The method of claim 14, wherein the probe card further includes third and fourth probes both electrically coupled to a third electrical contact of the DUT, the method further comprising:

sending a seventh signal from the test equipment module to the third probe;

sending the seventh signal from the fourth probe to the test module; and sending an eighth signal from the test module to the test equipment module based on reception of the seventh signal at the test module.

16. The method of claim 14, wherein sending the third signal includes sending along each path serially one after the other.

17. A method comprising:

sending a first signal from a test equipment module to a test module by way of first and second probes among a plurality of probes of a probe card, wherein the first probe is coupled to a first electrical contact of a device under test (DUT), the first electrical contact is coupled to a second electrical contact of the DUT, and the second probe is coupled to the second electrical contact; and sending a second signal from the test module to the test equipment module, wherein the second signal indicates a connectivity status of the first and second probes;

wherein the plurality of probes further includes third and fourth probes both coupled to a third electrical contact of the DUT, the method further comprising:

sending a third signal from the test equipment module to the test module by way of the third and fourth probes;

sending a fourth signal from the test module to the test equipment module based on reception of the third signal at the test module.

* * * * *